United States Patent
Kouznetsov et al.

(10) Patent No.: US 6,501,816 B1
(45) Date of Patent: Dec. 31, 2002

(54) FULLY PROGRAMMABLE MULTIMODULUS PRESCALER

(75) Inventors: Konstantin Kouznetsov, San Diego, CA (US); Daniel Linebarger, Los Gatos, CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/876,792

(22) Filed: Jun. 7, 2001

(51) Int. Cl.[7] .............................................. H03K 21/00
(52) U.S. Cl. ........................... 377/48; 377/52; 377/116; 327/115; 327/117
(58) Field of Search ............................ 377/48, 116, 52; 327/115, 117

(56) References Cited

U.S. PATENT DOCUMENTS 5,339,345 A * 8/1994 Mote, Jr. ..................... 377/48

OTHER PUBLICATIONS

Michael H. Perrott et al., "A 27–mW CMOS Fractional–N Synthesizer Using Digital Compensation for 2/5–Mb/s GFSK Modulation", IEEE Journal of Solid–State Circuits, vol. 32, No.12, pp. 2048–2060, Dec. 1997.

Cicero Vaucher et al., "A Wide–Band Tuning System for Fully Integrated Satellite Receivers", IEEE Journal of Solid–State Circuits, vol. 33, No. 7, pp. 987–997, Jul. 1998.

* cited by examiner

Primary Examiner—Margaret R. Wambach
(74) Attorney, Agent, or Firm—Blakely, Sokoloff, Taylor & Zafman LLP

(57) ABSTRACT

The present invention is a method and system for a fully programmable modulus pre-scaler. In one embodiment, the pre-scaler is a cascade of fully programmable divide-by-⅔ sections. A fully programmable divide-by-⅔ section includes a state machine and a control circuit. The state machine generates a modulus control output synchronously with a clock signal in response to a modulus control input and a programming signal. The state machine has a plurality of states corresponding to a ⅔ divider. The control circuit is coupled to the state machine to generate the programming signal to the state machine in response to a programming word for a frequency divider.

21 Claims, 6 Drawing Sheets

| PRESENT STATE | | INPUTS | | | INTERNAL CONTROL SIGNALS | | MODULUS CONTROL OUTPUT | NEXT STATE | |
|---|---|---|---|---|---|---|---|---|---|
| $q1_k$ | $q0_k$ | $d_N\ d_{N-1}\ \cdots\ d_{k+1}$ | $d_k$ | $MCI_k$ | $PGM_k$ | $\overline{RST}_k$ | $MCO_k$ | $q1_{k+1}$ | $q0_{k+1}$ |
| 0 | 0 | X — 1 — X | 0 | 0 | 0 | 1 | 0 | 1 | 0 |
| 0 | 1 | X — 1 — X | 0 | 0 | 0 | 1 | 0 | 1 | 0 |
| 1 | 0 | X — 1 — X | 0 | 0 | 0 | 1 | 0 | 0 | 0 |
| 1 | 1 | X — 1 — X | 0 | 0 | 0 | 1 | 0 | 1 | 0 |
| 0 | 0 | X — 1 — X | 0 | 1 | 0 | 1 | 1 | 1 | 0 |
| 0 | 1 | X — 1 — X | 0 | 1 | 0 | 1 | 1 | 1 | 0 |
| 1 | 0 | X — 1 — X | 0 | 1 | 0 | 1 | 0 | 0 | 0 |
| 1 | 1 | X — 1 — X | 0 | 1 | 0 | 1 | 0 | 1 | 0 |
| 0 | 0 | X — 1 — X | 1 | 0 | 1 | 1 | 0 | 1 | 0 |
| 0 | 1 | X — 1 — X | 1 | 0 | 1 | 1 | 0 | 1 | 0 |
| 1 | 0 | X — 1 — X | 1 | 0 | 1 | 1 | 0 | 0 | 0 |
| 1 | 1 | X — 1 — X | 1 | 0 | 1 | 1 | 0 | 1 | 0 |
| 0 | 0 | X — 1 — X | 1 | 1 | 1 | 1 | 1 | 1 | 1 |
| 0 | 1 | X — 1 — X | 1 | 1 | 1 | 1 | 1 | 1 | 1 |
| 1 | 0 | X — 1 — X | 1 | 1 | 1 | 1 | 0 | 0 | 0 |
| 1 | 1 | X — 1 — X | 1 | 1 | 1 | 1 | 0 | 1 | 0 |
| 0 | 0 | 0 — 1 — 0 | X | 0 | 0 | 0 | 0 | 0 | 0 |
| 0 | 1 | 0 — 1 — 0 | X | 0 | 0 | 0 | 0 | 0 | 0 |
| 1 | 0 | 0 — 1 — 0 | X | 0 | 0 | 0 | 0 | 0 | 0 |
| 1 | 1 | 0 — 1 — 0 | X | 0 | 0 | 0 | 0 | 0 | 0 |
| 0 | 0 | 0 — 1 — 0 | X | 1 | 0 | 0 | 1 | 0 | 0 |
| 0 | 1 | 0 — 1 — 0 | X | 1 | 0 | 0 | 1 | 0 | 0 |
| 1 | 0 | 0 — 1 — 0 | X | 1 | 0 | 0 | 1 | 0 | 0 |
| 1 | 1 | 0 — 1 — 0 | X | 1 | 0 | 0 | 1 | 0 | 0 |

FIG. 4A

FULLY PROGRAMMABLE MULTIMODULUS PRESCALER

BACKGROUND

FIELD OF THE INVENTION

This invention relates to digital circuits. In particular, the invention relates to pre-scaler.

BACKGROUND OF THE INVENTION

Pre-scaler circuits are useful in many applications such as clock generation in digital circuits and phase-locked loop (PLL) circuits. It is usually desired to divide a clock signal by an integer N.

Existing techniques to provide divide-by-N uses a series of divide by $\frac{2}{3}$ sections. These techniques are limited to division ratios between $2^k$ and $2^k+1-1$, where k is the number of the 2–3 cells in cascade. These techniques therefore cannot be used for division ratios beyond the bands of $2^k$ and $2^k+1-1$. In addition, the reloading of these circuits is done asynchronously by a separate strobe signal. The asynchronous reloading typically leads to additional hardware, added power consumption and high noise.

BRIEF DESCRIPTION OF THE DRAWINGS

The features and advantages of the present invention will become apparent from the following detailed description of the present invention in which:

FIG. 4A is a diagram illustrating a truth table for the programmable divide-by-$\frac{2}{3}$ according to one embodiment of the invention.

DETAILED DESCRIPTION OF THE INVENTION

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention.

Figure 1:
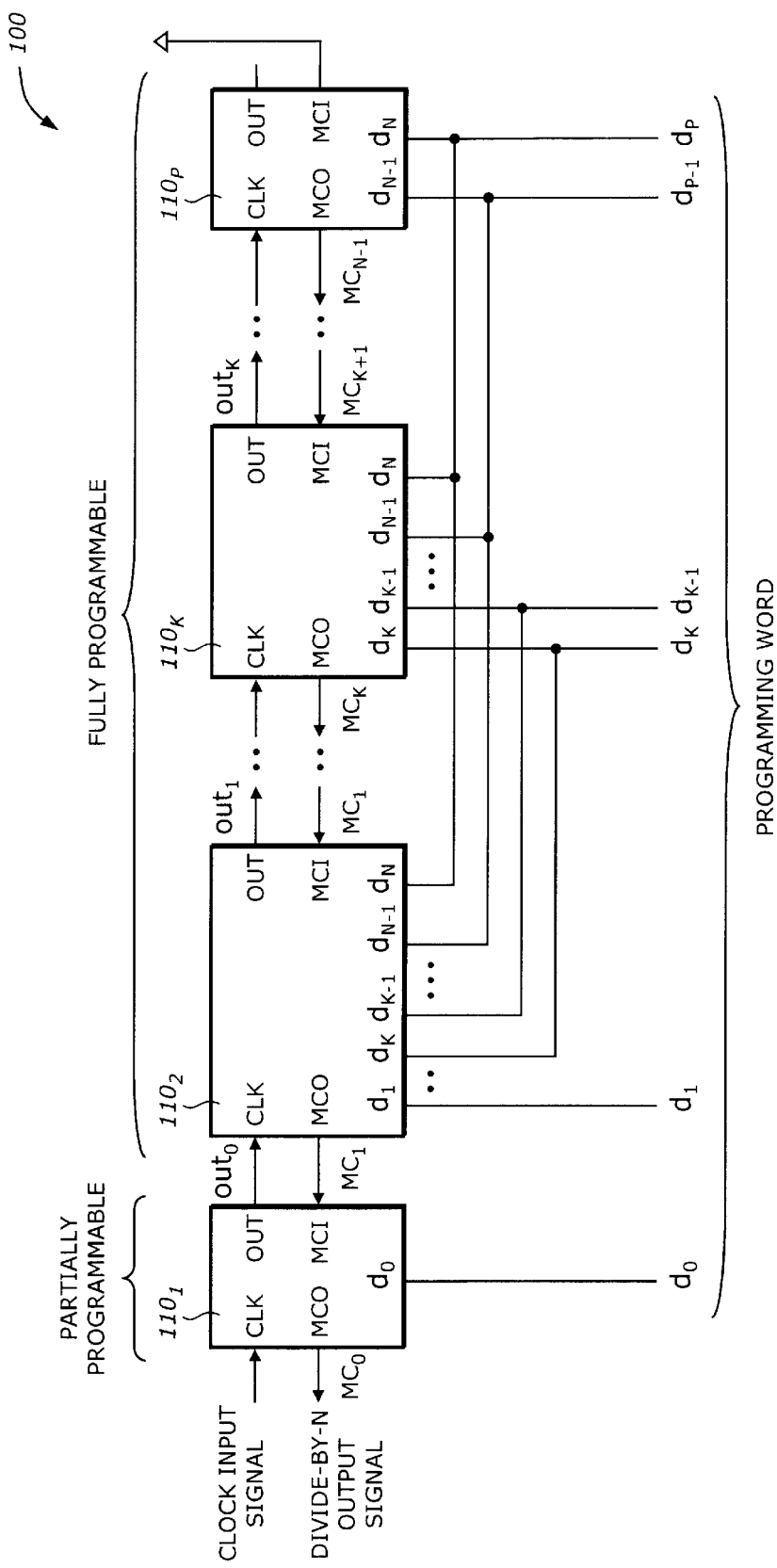
FIG. 1 is a diagram illustrating a system in which one embodiment of the invention can be practiced.

FIG. 1 is a diagram illustrating a system 100 in which one embodiment of the invention can be practiced. The system 100 may operate as a divide-by-N circuit to divide the frequency of a clock input signal by N. The system 100 may be used in a number of applications including clock generators in digital circuits, fully programmable multi-modulus pre-scaler. The pre-scaler may be used in a variety of phased-locked loops (PLL's), including $\Sigma-\Delta$ fractional-N PLL, to achieve low phase noise and low power consumption. The system 100 includes P programmable divide-by-$\frac{2}{3}$ circuits $110_1$ to $110_P$.

The P programmable divide-by-$\frac{2}{3}$ circuits $110_1$ to $110_P$ are connected in series or cascaded to form a chain of divide-by-N circuit. The circuit $110_1$ is the least significant divide-by-$\frac{2}{3}$ circuit and the circuit $110_P$ is the most significant divide-by-$\frac{2}{3}$ circuit. The circuit $110_1$ receives a clock input signal representing the clock signal whose frequency is to be divided. The circuit 101 generates a divide-by-N output signal which has a frequency equal to 1/N of the frequency of the clock input signal.

The P programmable divide-by-$\frac{2}{3}$ circuits $110_1$ to $110_P$ receive a programming word $d_P d_{P-1} \ldots d_{k+1} d_k \ldots d_1 d_0$ which is the binary representation of the divider N where do is the least significant bit (LSB) and $d_P$ is the most significant bit (MSB). The circuit $110_1$ is referred to as the least significant (LS), or partially, programmable divide-by-$\frac{2}{3}$ circuit. It receives the LSB of N, $d_0$, as a programming bit. The circuits $110_2$ to $110_P$ receive the remaining programming bits of the programming word. These circuits are referred to as the next significant (NS), or fully, programmable divide-by-$\frac{2}{3}$ circuits. In particular, the circuit $110_P$ is referred to as the most significant (MS), or fully, programmable divide-by-$\frac{2}{3}$ circuit. In one embodiment, the circuit $110_1$ may also be the same as or a straight forward modification of the circuits $110_2$ to $110_P$.

Each of the P programmable divide-by-$\frac{2}{3}$ circuits $110_1$ to $110_P$ has a clock (CLK) input, a modulus control input (MCI), a modulus control output (MC0) and an OUT output. The OUT output of a circuit is connected to the CLK input of the next significant circuit. The MCI of a circuit is connected to the MC0 of the next significant circuit. The MC0 of the LS circuit $110_1$ provides the final divide-by-N output signal. The clock input signal is connected to the CLK input of the LS circuit $110_1$. The MCI of the MS circuit $110_P$ is connected to a logical HIGH. Over all divide-by-N output may also be taken from MCI signals of NS sections, depending on the embodiment.

Figure 2:
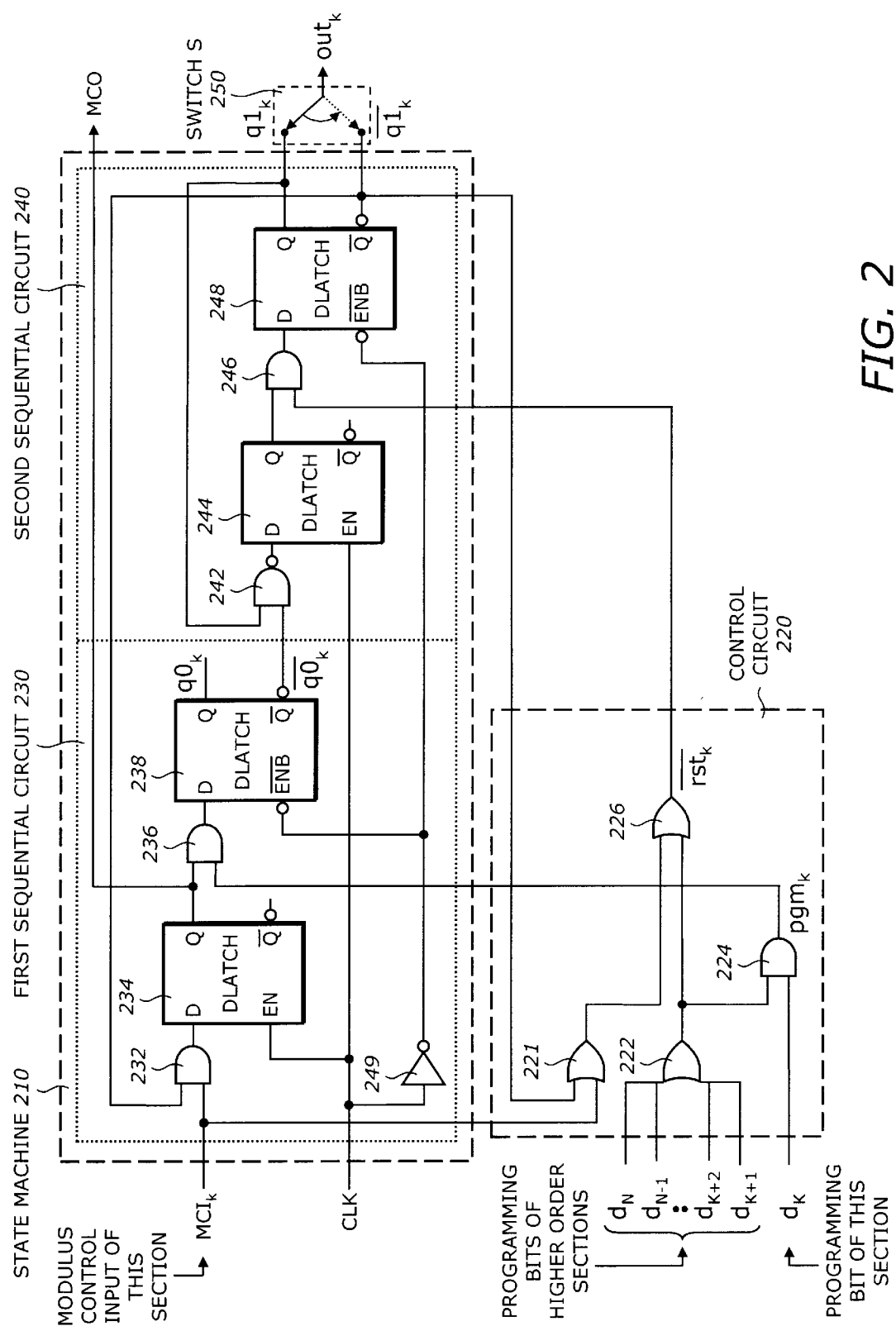
FIG. 2 is a diagram illustrating a fully programmable divide-by-$\frac{2}{3}$ circuit according to one embodiment of the invention.

FIG. 2 is a diagram illustrating a fully programmable divide-by-$\frac{2}{3}$ circuit $110_2$ to $110_P$ according to one embodiment of the invention. For brevity the subscript is dropped. The circuit 110 includes a state machine 210 and a control circuit 220.

The state machine 210 is a sequential circuit that generates the MC0 synchronously with $\overline{rst}_k$ the CLK input in response to the MCI and programming signals pgm and $\overline{rst}_k$ from the control circuit 220. The state machine 210 has a plurality of states corresponding to a $\frac{2}{3}$ divider. For a $\frac{2}{3}$ divider, the number of states can be represented by two bits q1q0. These two bits are generated by the state machine 210.

The state machine 210 includes a first sequential circuit 230 and a second sequential circuit 240. The first sequential circuit 230 provides a first state output signal q0 and an MC0 output in response to the MCI and the programming signal pgm. The second sequential circuit 240 is coupled to the first sequential circuit 230 to provide a second state output signal q1 in response to the first state output signal q0 and the reset signal $\overline{rst}_k$. The first and second state output signals q0 and q1 specify the states of the state machine 210. The second state output signal q1 has a complementary signal q1#. Either q1 or q1# signals may be used as the OUT output depending on the embodiment. The selection of which one of the q1 and q1# may be done by the switch S 250.

The first sequential circuit 230 includes a first logic circuit 232, a first latch 234, a second logic circuit 236, and a second latch 238. The first logic circuit 232 generates a first latch input signal from the MCI and a complement of the second state output signal, i.e., the q1# signal. In one embodiment, the first logic circuit 232 is an AND gate. The first latch 234 generates the MC0 from the first latch input signal. The first latch 234 is enabled by the clock signal CLK. When the CLK signal is HIGH, the first latch input signal is transferred to the output of the first latch 234. When the CLK signal is LOW, the first latch 234 holds its output unchanged.

The second logic circuit 236 generates a second latch input signal from the MC0 and the programming signal pgm. In one embodiment, the second logic circuit 236 is an AND gate. The second latch 238 generates the first state output signal q0 from the second latch input signal. The second latch 238 is enabled by the inverted clock signal. When the CLK signal is LOW, the second latch input signal is transferred to the output of the second latch 238. When the CLK signal is HIGH, the second latch 238 holds its output unchanged. The second latch 238 also generates the complement of the first state output signal q0#.

The second sequential circuit 240 includes a third logic circuit 242, a third latch 244, a fourth logic circuit 246, and a fourth latch 248. The third logic circuit 242 generates a third latch input signal from the q0# signal and the second state output signal, i.e., the q1 signal. In one embodiment, the third logic circuit 242 is an NAND gate. The third latch 244 generates a third latch output signal from the third latch input signal. The third latch 244 is enabled by the clock signal CLK. When the CLK signal is HIGH, the third latch input signal is transferred to the output of the third latch 244. When the CLK signal is LOW, the third latch 244 holds its output unchanged.

The fourth logic circuit 246 generates a fourth latch input signal from the third latch output signal and the reset signal rst. In one embodiment, the fourth logic circuit 246 is an AND gate. The fourth latch 248 generates the second state output signal q1 from the fourth latch input signal. The fourth latch 248 is enabled by the inverted clock signal. When the CLK signal is LOW, the fourth latch input signal is transferred to the output of the fourth latch 248. When the CLK signal is HIGH, the fourth latch 248 holds its output unchanged. The fourth latch 248 also generates the complement of the first state output signal q1#.

The control circuit 220 generates the programming signal pgm to the state machine in response to the programming word $d_P d_{P-1} \ldots d_{k+1} d_k \ldots d_1$ for the frequency divider N. The control circuit 220 also generates the reset signal rst from the programming word $d_P d_{P-1} \ldots d_{k+1} d_k \ldots d_1$ and the MCI. In one embodiment, the control circuit 220 includes a 2-input OR gate 221, and (P−k)-input OR gate 222, a 2-input OR gate 224, and an AND gate 226.

The 2-input OR gate 221 performs an logical OR operation on the MCI and the second state output signal q1. The (P−k)-input OR gate 222 performs a logical OR operation on the (P−k) programming bits of the programming word $d_P d_{P-1} \ldots d_{k+1}$. The 2-input OR gate 224 performs a logical OR operation on the outputs of the 2-input OR gate 221 and the P-input OR gate 222. The AND gate 226 performs an AND operation on the output of the P-input OR gate 222 and the $d_k$ programming bit. The AND gate 226 generates the programming signal pgm.

Figure 3:
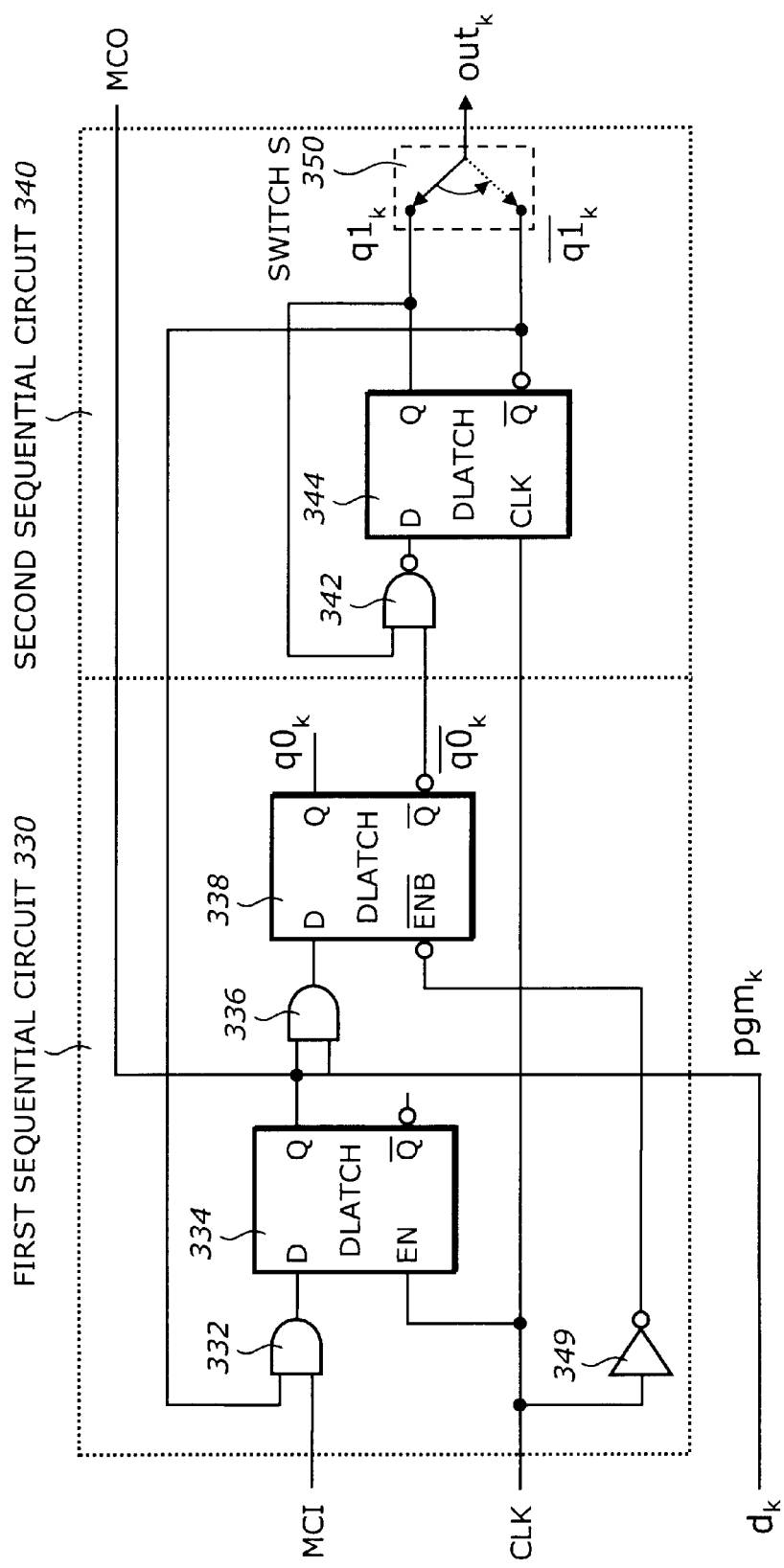
FIG. 3 is a diagram illustrating a partially programmable divide-by-$\frac{2}{3}$ circuit according to one embodiment of the invention.

FIG. 3 is a diagram illustrating the partially programmable divide-by-⅔ circuit $110_1$ according to one embodiment of the invention. The partially programmable divide-by-⅔ circuit $110_1$ is similar to the fully programmable circuit with fewer components and includes a state machine 310. The also has a plurality of states specified by the state output signals q1 and q0.

The state machine 310 includes a first sequential circuit 330 and a second sequential circuit 340. The first sequential circuit 330 is similar to the first sequential circuit 230 shown in FIG. 2. The first sequential circuit 330 includes a first logic circuit 332, a first latch 334, a second logic circuit 336, and a second latch 338. The first logic circuit 332 generates a first latch input signal from the MCI and a complement of the second state output signal, i.e., the q1# signal. In one embodiment, the first logic circuit 332 is an AND gate. The first latch 334 generates the MC0 from the first latch input signal. The first latch 334 is enabled by the clock signal CLK. When the CLK signal is HIGH, the first latch input signal is transferred to the output of the first latch 334. When the CLK signal is LOW, the first latch 334 holds its output unchanged.

The second logic circuit 336 generates a second latch input signal from the MC0 and the programming signal pgm. In one embodiment, the second logic circuit 336 is an AND gate. The second latch 338 generates the first state output signal q0 from the second latch input signal. The second latch 338 is enabled by the inverted clock signal. When the CLK signal is LOW, the second latch input signal is transferred to the output of the second latch 338. When the CLK signal is HIGH, the second latch 338 holds its output unchanged. The second latch 338 also generates the complement of the first state output signal q0#.

The second sequential circuit 340 includes a third logic circuit 342 and a third latch 344. The third logic circuit 342 generates a third latch input signal from the q0# signal and the second state output signal, i.e., the q1 signal. In one embodiment, the third logic circuit 342 is an NAND gate. The third latch 344 generates the second state output signal q1 and its complement q1#. The output of the second sequential circuit 340 may be q1 or q1# via a switch 350. The third latch 344 is enabled by the clock signal CLK. When the CLK signal is HIGH, the third latch input signal is transferred to the output of the third latch 344. When the CLK signal is LOW, the third latch 344 holds its output unchanged.

Note that the circuit for both fully and partially programmable circuits or sections implements the logic circuits with AND or NAND gates which are inserted between latches. This arrangement minimizes propagation delays in the critical timing path. The result is that low power and low noise operation can be achieved. In addition, the least significant circuit (e.g., the circuit $110_1$ shown in FIG. 1) is partially programmable and is always active and requires only programming of the modulus control. A partially programmable circuit of a given order requires less hardware and consumes less power compared to the fully programmable circuit. More than one circuit can be made partially programmable.

FIG. 4A is a diagram illustrating a truth table for the programmable divide-by-⅔ circuit according to one embodiment of the invention.

The truth table for the programmable divide-by-⅔ circuit essentially provides for the implementation of the programming signal pgm and the reset signal rst. The programming signal pgm and the reset signal rst are generated according to the following logic equations:

$$\text{pgm}_k = (d_P + d_{P-1} + \ldots + d_{k+1}) \cdot d_k \quad (1)$$

$$\text{rst}_k = d_P + d_{P-1} + \ldots + d_{k+1} + \text{MCI}_k + q1_k \quad (2)$$

In the above logic equations, + and * correspond to logical OR and AND operations, respectively.

Figure 4B:
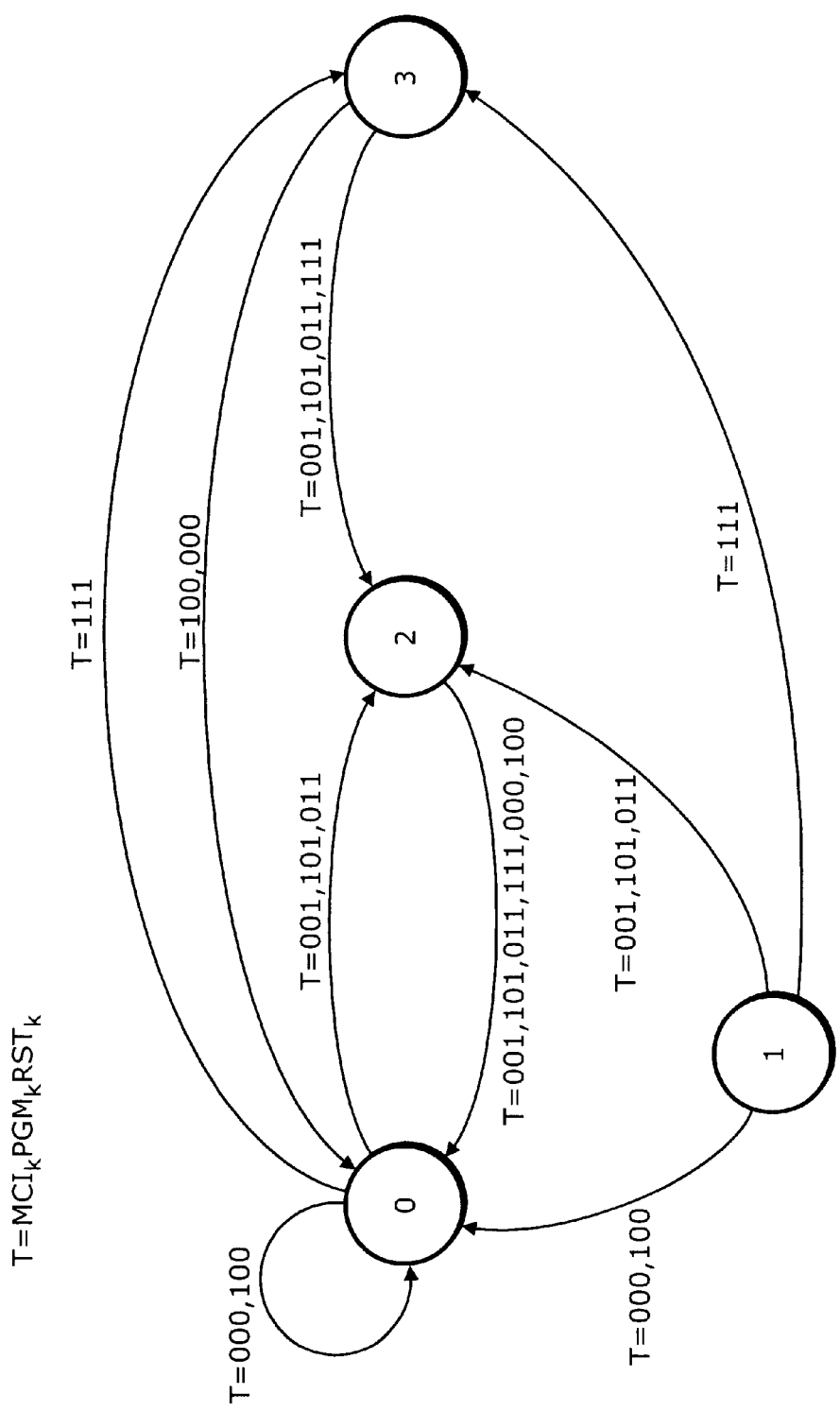
FIG. 4B is a diagram illustrating a state diagram for the programmable divide-by-$\frac{2}{3}$ circuit according to one embodiment of the invention.

FIG. 4B is a diagram illustrating a state diagram for the programmable divide-by-⅔ circuit according to one embodiment of the invention. The state diagram includes four states 0, 1, 2, and 3 corresponding to the state output signals q1q0=00, 01, 10, and 11, respectively.

The state diagram shows the transition of a present state to a next state as a function of the input $T=MCI_k\ pgm_k\ rst_k$. The notation in the state diagram is the binary representation of T. For example, T=001 indicates that $MCI_k=0$, $pgm_k=0$, and $rst_k=1$. Note, that the condition $\overline{rst}_k=0$ ensures that $pgm_k=0_1$, and, therefore, inputs 010 and 110 are not realizable State 0 goes to itself when T=000, 100. State 0 never goes to state 1. State 0 transitions to state 2 when T=001, 101, or 011. State 0 transitions to state 3 when T=111.

State 1 never goes to itself. State 1 goes to state 0 when T=000, 100. State 1 goes to state 2 when T=001, 101, 011. State 1 goes to state 3 when T=111.

State 2 always goes to state 0, i.e., for all T=001, 101, 011, 000, 100, 111.

State 3 goes to state 0 when T=100, 000. State 3 never goes to state 1. State 3 goes to state 2 when T=001, 101, 011, 111.

Note that some combination of the inputs causing the state transitions may not be realizable and these correspond to don't cares.

Since state 1 is not a destination of any state, it can be eliminated from the state diagram. The state machine therefore has only states 0, 2, and 3. This is consistent with the divide-by-⅔ principle. The state diagram illustrates the operation for the state machine to go across the $2^k$ to $2^{k+1}-1$ band boundaries.

For example, the case of dividing by 3 followed by dividing by 3 cycles is achieved by the following state sequence:

$$3 \rightarrow 2 \rightarrow 0 \rightarrow 2 \rightarrow 0 \rightarrow 2 \rightarrow 0 \ldots$$

where the number indicates the state number corresponding to the (q1, q0) state output signals as shown in FIGS. 2 and 3. The sequence of states corresponds to "swallowing" one pulse of an input signal at the beginning of the cycle. Here, the output state does not change until the third count.

The sequence for dividing by 2 is achieved by the following state sequence:

$$2 \rightarrow 0 \rightarrow 2 \rightarrow 0 \rightarrow 2 \rightarrow 0 \ldots$$

This sequence is identical to a toggle flip-flop operation.

For an operation beyond the range of $2^k$ to $2^{k+1}-1$ certain sections or circuits in the chain of circuits shown in FIG. 1 need to be turned on and off simultaneously with complete reprogramming of the divider at the end of each cycle. The method of activating and deactivating certain sections is based on the fact that each counting sequence ends in a state 00 and begins by a transition from state 0 to either state 2 or 3. Therefore, in order to disable a given circuit from the next count, the higher order section(s) are disabled and the circuit undergoes synchronous transition from state 0 to 0 at the end of its local count. For example, the sequence $3 \rightarrow 2 \rightarrow \underline{0} \rightarrow 2 \rightarrow \underline{0} \rightarrow 2 \rightarrow \underline{0} \rightarrow \underline{0} \ldots$ ensures that a given circuit and all subsequent or less significant circuits are inactive in the next cycle. The disabling transition is shown underlined. When made inactive, the ⅔ circuits are held in state 0 and MC0=1 to ensure quick activation for further count.

Figure 5:
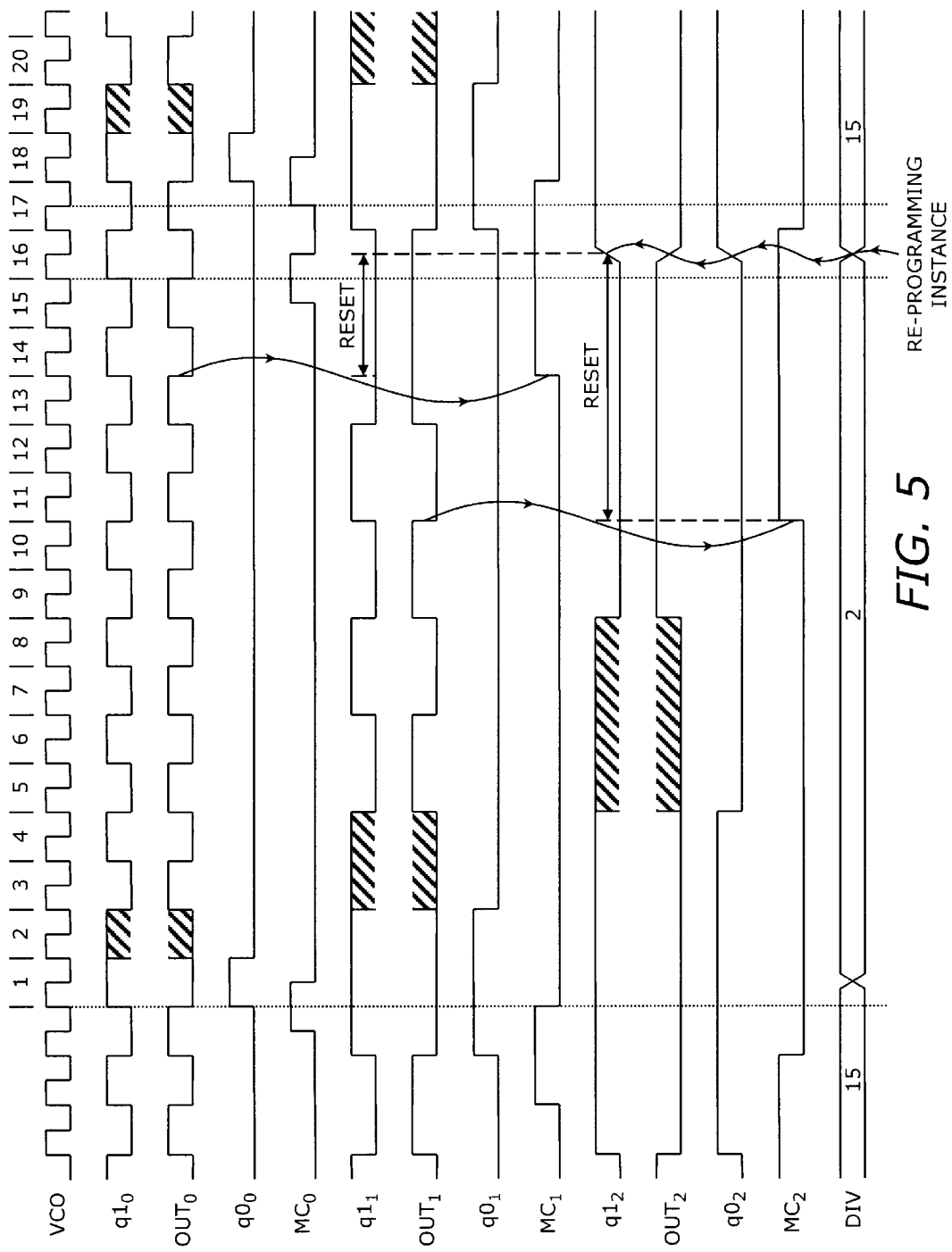
FIG. 5 is a timing diagram illustrating the waveforms of the signals for the programmable divide-by-$\frac{2}{3}$ circuit according to one embodiment of the invention.

FIG. 5 is a timing diagram illustrating the waveforms of the signals for the programmable divide-by-⅔ circuit according to one embodiment of the invention.

The timing diagram shows the waveforms of the signals q1, q0. MC0, MC1, and MC2 for a 4-bit example. The timing diagram illustrates a change of count from 15 to 2 as shown in the MC0 waveform. Vertical dotted lines indicate the end-of-count instances. "Swallowed" pulses are shown by shaded areas. Transitions triggered by the programming input are indicated with arrows and dashed lines on the timing diagram.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. An apparatus comprising:
   a state machine to generate a modulus control output synchronously with a clock signal in response to a modulus control input and a programming signal, the state machine having a plurality of states corresponding to a ⅔ divider; and
   a control circuit coupled to the state machine to generate the programming signal to the state machine in response to a programming word for a frequency divider.

2. The apparatus of claim 1 wherein the state machine comprises:
   a first sequential circuit to provide a first state output signal in response to the modulus control input and the programming signal; and
   a second sequential circuit coupled to the first sequential circuit to provide a second state output signal in response to the first state output signal and a reset signal, the first and second state output signals specifying the states of the state machine.

3. The apparatus of claim 2 wherein the first sequential circuit comprises:
   a first logic circuit to generate a first latch input signal from the modulus control input and a complement of the second state output signal;
   a first latch coupled to the first logic circuit to generate the modulus control output from the first latch in put signal, the first latch being enabled by the clock signal;
   a second logic circuit coupled to the first latch to generate a second latch input signal from the modulus control output and the programming signal; and
   a second latch coupled to the second logic circuit to generate the first state output signal from the second latch input signal, the second latch being enabled by the clock signal.

4. The apparatus of claim 3 wherein one of the first and second logic circuits is an AND gate.

5. The apparatus of claim 3 wherein the second sequential circuit comprises:
   a third logic circuit to generate a third latch input signal from the second state output signal and a complement of the first state output signal; and
   a third latch coupled to the first logic circuit to generate one of a third latch output signal and the second state output signal from the third latch input signal, the third latch being enabled by the clock signal.

6. The apparatus of claim 5 wherein the second sequential circuit further comprises:
   a fourth logic circuit coupled to the third latch to generate a fourth latch input signal from the third latch output signal and the reset signal; and a fourth latch coupled to the fourth logic circuit to generate the second state output signal, the fourth latch being enabled by the clock signal.

7. The apparatus of claim 3 wherein the third logic circuit is a NAND gate.

8. The apparatus of claim 6 wherein the fourth logic circuit is an AND gate.

9. The apparatus of claim 2 wherein the programming word includes a first programming bit and one or more higher order programming bit.

10. The apparatus of claim 9 wherein the control circuit comprises:

a programming generator to assert the programming signal when the one or more higher order programming bit has at least a logical one and the first programming bit is a logical one; and a reset generator to assert the reset signal when the one or more higher order programming bit corresponds to a logical zero word.

11. A method comprising:

generating a modulus control output synchronously with a clock signal in response to a modulus control input and a programming signal by a state machine, the state machine having a plurality of states corresponding to a ⅔ divider; and generating the programming signal to the state machine in response to a programming word for a frequency divider by a control circuit.

12. The method of claim 11 wherein generating the modulus control output comprises:

providing a first state output signal in response to the modulus control input and the programming signal by a first sequential circuit; and providing a second state output signal in response to the first state output signal and a reset signal by a second sequential circuit, the first and second state output signals specifying the states of the state machine.

13. The method of claim 12 wherein providing the first state output signal comprises:

generating a first latch input signal from the modulus control input and a complement of the second state output signal by a first logic circuit;

generating the modulus control output from the first latch input signal by a first latch, the first latch being enabled by the clock signal;

generating a second latch input signal from the modulus control output and the programming signal by a second logic circuit; and generating the first state output signal from the second latch input signal by a second latch, the second latch being enabled by the clock signal.

14. The method of claim 13 wherein one of the first and second logic circuits is an AND gate.

15. The method of claim 13 wherein providing the second state output signal comprises:

generating a third latch input signal from the second state output signal and a complement of the first state output signal by a third logic circuit; and generating one of a third latch output signal and the second state output signal from the third latch input signal by a third latch, the third latch being enabled by the clock signal.

16. The method of claim 15 wherein providing the second state output signal further comprises:

generating a fourth latch input signal from the third latch output signal and the reset signal by a fourth logic circuit; and generating the second state output signal by a fourth latch, the fourth latch being enabled by the clock signal.

17. The method of claim 13 wherein the third logic circuit is a NAND gate.

18. The method of claim 16 wherein the fourth logic circuit is an AND gate.

19. The method of claim 12 wherein the programming word includes a first programming bit and one or more higher order programming bit.

20. The method of claim 19 wherein generating the programming signal comprises:

asserting the programming signal when the one or more higher order programming bit has at least a logical one and the first programming bit is a logical one by a programming generator; and asserting the reset signal when the one or more higher order programming bit corresponds to a logical zero word by a reset generator.

21. A pre-scaler circuit comprising:

a least significant (LS) programmable circuit to generate a divide-by-N signal, N being an integer, from a clock input signal using a next significant (NS) modulus control output signal and a LS programming signal, the LS programmable circuit generating a LS modulus control output signal, the LS programmable circuit comprising:

a LS state machine to generate a LS modulus control output synchronously with a clock signal in response to a LS modulus control input and LS programming and reset signals, the LS state machine having a plurality of states corresponding to a ⅔ divider, and a LS control circuit coupled to the LS state machine to generate the LS programming and reset signals to the LS state machine in response to a LS programming bit for a frequency divider; and N NS programmable circuits coupled to the LS programmable circuit to generate the next significant modulus control output signal using a programming word corresponding to N.

* * * * *